United States Patent
Jacobsen et al.

(10) Patent No.: US 6,316,278 B1
(45) Date of Patent: Nov. 13, 2001

(54) METHODS FOR FABRICATING A MULTIPLE MODULAR ASSEMBLY

(75) Inventors: Jeffrey Jay Jacobsen, Hollister, CA (US); Glenn Wilhelm Gengel, Berthoud, CO (US); Gordon S. W. Craig, Palo Alto, CA (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

(21) Appl. No.: 09/270,159

(22) Filed: Mar. 16, 1999

(51) Int. Cl.[7] .................................................... H01L 21/00
(52) U.S. Cl. ............................. 438/22; 438/106; 438/23; 438/24
(58) Field of Search .............................. 438/106, 22, 23, 438/24, 30; 313/511; 250/208.1; 156/655.1

(56) References Cited

U.S. PATENT DOCUMENTS

| | | | |
|---|---|---|---|
| 3,780,352 | 12/1973 | Redwanz | 317/101 |
| 5,363,275 | 11/1994 | Frankeny et al. | 361/749 |
| 5,469,020 | * 11/1995 | Herrick | 313/511 |
| 5,565,706 | 10/1996 | Miura et al. | 257/723 |
| 5,734,155 | * 3/1998 | Rostoker | 250/208.1 |
| 5,824,186 | * 10/1998 | Smith et al. | 156/655.1 |

FOREIGN PATENT DOCUMENTS

| | | | |
|---|---|---|---|
| 0 747 948 A2 | 12/1996 | (EP) | H01L/21/98 |
| WO 99/67678 | 12/1999 | (WO) | G02F/1/00 |

OTHER PUBLICATIONS

Nakamura, Eiji, et al.; 37.3: Development Of Electrophoretic Display Using Microcapsulated Suspension; SID International Symposium Digest of Technical Papers, US, Santa Ana, CA SID vol. 29, 1998, pp. 1014–1017.

Wu, C.C., et al.; Integration Of Organic LED's And Amorphous Si TFT's Onto Flexible And Lightweight Metal Foil Substrates; IEEE Electron Device Letters, US, IEEE Inc., New York, vol. 18, No. 12, Dec. 1, 1997, pp. 609–612.

Search Report for PCT/US 00/02375; mailed Jun. 6, 2000; 5 pages.

* cited by examiner

*Primary Examiner*—David Nelms
*Assistant Examiner*—Dung A Le
(74) *Attorney, Agent, or Firm*—Blakely, Sokoloff, Taylor & Zafman

(57) ABSTRACT

Methods and apparatus for fabricating a multiple display modular assembly. In one example of a method, a first flexible layer is coupled to a substrate, a second flexible layer is coupled to the first flexible layer, and a third flexible layer is coupled to the second flexible layer. Each of the flexible layers may be generated from a separate web-line process. In one example, one flexible layer may have a display plane with a driver backplane, a second flexible layer may have a fine interconnect, and a third flexible layer may have gross interconnect. The multiple flexible layer modular assembly may apply to either flexible or rigid displays.

27 Claims, 17 Drawing Sheets

METHODS FOR FABRICATING A MULTIPLE MODULAR ASSEMBLY

BACKGROUND OF THE INVENTION

1. Field of the Invention

The present invention relates generally to the field of fabricating modular assemblies. More particularly, the present invention relates methods for forming displays using multiple flexible layers.

2. Description of Related Art

Fabrication of display panels is well known in the art. Display panels may be comprised of active matrix or passive matrix panels. Active matrix panels and passive matrix panels may be either transmissive or reflective. Transmissive displays include polysilicon thin-film transistor (TFT) displays, and high-resolution polysilicon displays. Reflective displays typically comprise single crystal silicon integrated circuit substrates that have reflective pixels.

Liquid crystals, electroluminescent (EL) materials, organic light emitting diodes (OLEDs), up and downconverting phosphor (U/DCP), electrophoretic (EP) materials, or light emitting diodes (LEDs) may be used in fabricating flat-panel display panels. Each of these is known in the art and is discussed briefly below.

Liquid crystal displays (LCDs) can have an active matrix backplane in which thin-film transistors are co-located with LCD pixels. Flat-panel displays employing LCDs generally include five different components or layers: a White or sequential Red, Green, Blue light source, a first polarizing filter, that is mounted on one side of a circuit panel on which the TFTs are arrayed to form pixels, a filter plate containing at least three primary colors arranged into pixels, and a second polarizing filter. A volume between the circuit panel and the filter plate is filled with a liquid crystal material. This material will rotate the polarized light when an electric field is applied between the circuit panel and a transparent ground electrode affixed to the filter plate or a cover glass. Thus, when a particular pixel of the display is turned on, the liquid crystal material rotates polarized light being transmitted through the material so that it will pass through the second polarizing filter. Some liquid crystal materials, however, require no polarizers. LCDs may also have a passive matrix backplane which is usually two planes of strip electrodes which sandwich the liquid crystal material. However, passive matrices generally provide a lower quality display compared to active matrices. Liquid crystal material includes, but is not limited to, twisted nematic (TN), Super TN, double STN, and ferroelectric. U/DCP and EP displays are formed in a similar fashion except the active medium is different (e.g., upconverting gas, downconverting gas, electrophoretic materials).

EL displays have one or more pixels that are energized by an alternating current (AC) that must be provided to each pixel by row and column interconnects. EL displays generally provide a low brightness output because passive circuitry for exciting pixel phosphors typically operates at a pixel excitation frequency that is low relative to the luminance decay time of the phosphor material. However, an active matrix reduces the interconnect capacitance allowing the use of high frequency AC in order to obtain more efficient electroluminescence in the pixel phosphor. This results in increased brightness in the display.

LED displays are also used in flat-panel displays. LEDs emit light when energized. OLEDs operate like the LEDs except OLEDs use organic material in the formation of the diode.

Regardless of the type of active medium used, displays are generally comprised of at least a substrate and a backplane. The backplane forms the electrical interconnection of the display and comprises electrodes, capacitors, and transistors in at least some embodiments of a backplane.

FIG. 1A illustrates a rigid display device wherein the active matrix display backplane 10 is coupled to a rigid substrate 12. Typically, the active matrix display backplane is also rigid. FIG. 1B shows another rigid display. There, the active matrix display backplane 10 is coupled to a rigid substrate 12 (e.g., glass). Also shown is a plurality of blocks 14. These blocks may be fabricated separately and then deposited into holes on substrate 12 by a process known as fluidic self assembly; an example of this process is described in U.S. Pat. No. 5,545,291. These blocks may each contain driver circuitry (e.g., MOSFET and capacitor) for driving a pixel electrode. The active matrix backplane includes transparent pixel electrodes and row/column interconnects (not shown) to electrically interconnect the blocks 14. The plurality of blocks 14 is coupled to the active matrix display backplane 10 and the rigid substrate 12. FIG. 1C shows a reflective display 16 coupled to a rigid substrate 12. FIG. 1D shows a reflective display 16 coupled to a rigid substrate 12. A plurality of blocks 14 is coupled to the reflective display 16 and to the rigid substrate 12.

Placing elements, such as pixel drivers, on a rigid substrate is well known. Prior techniques can be generally divided into two types: deterministic methods or random methods. Deterministic methods, such as pick and place, use a human or robot arm to pick each element and place it into its corresponding location in a different substrate. Pick and place methods generally place devices one at a time and are generally not applicable to very small or numerous elements such as those needed for large arrays, such as an active matrix liquid crystal display.

Random placement techniques are more effective and result in high yields if the elements to be placed have the right shape. U.S. Pat. No. 5,545,291 describes a method that uses random placement. In this method, microstructures are assembled onto a different substrate through fluid transport. This is sometimes referred to as fluidic self-assembly (FSA). Using this technique, various blocks, each containing a functional component, may be fabricated on one substrate and then separated from that substrate and assembled onto a separate rigid substrate through the fluidic self assembly (FSA) process. The blocks which are deposited onto receptor regions of a substrate may include any of a number of different functional components, such as LEDs, pixel drivers, sensors, etc. An example of a particular type of block and its functional component is described in copending U.S. patent application Ser. No. 09/251,220 which was filed Feb. 16,1999 by the inventor John Stephen Smith and which is entitled "Functionally Symmetric Integrated Circuit Die". This application is hereby incorporated herein by reference.

As noted above, FIGS. 1B and 1D illustrate a display substrate 12 with blocks 14 formed in the rigid substrate 12. These blocks 14 may be deposited through an FSA process. In the FSA process, a slurry containing the blocks 14 is deposited over the rigid substrate 12 and the blocks 14 rest in corresponding openings in the substrate 12.

FIG. 2 shows a block 14 and a circuit element (not shown) on the top surface 18 of block 14. Generally, blocks have a trapezoidal cross-section where the top of the block is wider than the bottom of the block.

FIG. 3 shows block 14 in a recessed region of the rigid substrate 12. Between the block and the rigid substrate is an eutectic layer 13. The block has a top surface 18.

FIG. 4 shows a planar side view of a rigid substrate coupled to a rigid display backplane with a plurality of blocks between the display backplane 30 and substrate 12. The plurality of blocks are functionally part of the display backplane 30 and are deposited onto receptor regions of the substrate 12. Each block drives at least one transparent pixel electrode. The pixel is fabricated over a transistor which is fabricated in the block.

FIG. 5 shows a portion of an array in an active matrix display backplane. The control line rows 31 and 32 in this device are coupled to gate electrodes along a row and the control line columns 34 and 35 are coupled to data drivers which supply pixel voltages which are applied to the pixel electrodes. A column line 34 is connected to a source electrode of field effect transistor (FET) 36. Another column line 35 is coupled to a source electrode of FET 37. A row line 32 is coupled to the gates of both FETs 36 and 37. The drain of FET 36 is coupled through capacitor 38 to a transparent pixel electrode along the row 32 formed by FETs 36 and 37, and the drain of FET 37 is coupled through a capacitor to another pixel electrode along the row. In one typical example, the backplane may be formed by depositing blocks, using an FSA technique, into a rigid substrate (e.g., glass); each block contains a FET and a capacitor and is interconnected to other blocks by column and row conductors that are deposited onto the rigid substrate; and, the capacitor is coupled to a pixel electrode by another conductor that is deposited onto the rigid substrate. The active medium (e.g., a liquid crystal) is deposited at least on the pixel electrodes which will optically change the active medium's properties in response to the combined voltages or currents produced by the pixel electrodes. The active medium at a given pixel electrode 42 will appear as a square or dot in the overall checkerboard type matrix of the display. The actual size of the FETs and the pixel electrodes 42 are not now drawn to scale, but are shown schematically for the purposes of illustration. The interconnect between the rows and columns is comprised of conductive material. FIG. 6 shows a top view of a plurality of pixel electrodes in a backplane.

There are several disadvantages inherent to the related art. Displays have lower composite yields than may be achieved because portions of the assembly are separately produced instead of being manufactured by a lamination-like method. Piecemeal production of portions of an assembly generally reduces productivity and increases costs.

Moreover, rigid flat-panel displays are limited in that they are generally coupled to rigid objects. Flexible objects may cause too much stress on rigid flat-panel displays that could affect the electrical interconnections in rigid flat-panel displays.

Another disadvantage to these flat-panel displays is that they are manufactured in a batch operation. Batch operations inherently involve a certain amount of down time in production. This increases production time to fabricate display panels. Additionally, flat-panel displays are generally fabricated on rigid substrates that are not continuous in length. This also decreases productivity since the assembly of the flat-panel displays is interrupted until another substrate panel is available to assemble the flat-panel display.

BRIEF SUMMARY OF THE INVENTION

The present invention provides methods and apparatuses for creating displays or other assemblies having multiple flexible layers that have an interconnect placed on at least one side of two flexible layers. The flexible layers are sequentially coupled to the substrate. For example, a first flexible layer is coupled to the substrate; a second flexible layer is coupled to the first flexible layer; and a third flexible layer is coupled to the second flexible layer. The first flexible layer may have a display backplane attached thereto; the second flexible layer may have a fine interconnect deposited thereon; and a third flexible layer may have a gross interconnect deposited thereon.

While an array of components (e.g. display components) for an assembly have been described as examples of the invention, an array of other assemblies such as x-ray detectors, radar detectors, micro-electro-mechanical structural elements (MEMS) or, generally, an assembly of sensors or actuators or an assembly of circuit elements also may be produced using the claimed invention. Thus, for example, flexible antennas, other sensors, detectors, or an array of circuit elements may be fabricated using one of the embodiments of the inventions. Other aspects and methods of the present invention as well as apparatuses formed using these methods are described further below in conjunction with the following figures.

BRIEF DESCRIPTION OF THE DRAWINGS

The invention is not limited to the figures of the accompanying drawings in which like references indicate similar elements. Note also that the following figures are not necessarily drawn to scale.

DETAILED DESCRIPTION OF THE INVENTION

The present invention relates to methods for forming displays or other assemblies. The following description and drawings are illustrative of the invention and are not to be construed as limiting the invention.

The invention provides higher composite yields by sequentially building a display which in turn reduces production costs. Moreover, multiple flexible layers (e.g. tapes) with interconnect deposited on each tape increases the wiring density thereby increasing display resolution. One embodiment in accordance with the invention includes a flexible display comprised of multiple flexible layers. For example, a first flexible layer is coupled to the substrate; a second flexible layer is coupled to the first flexible layer; and a third flexible layer is coupled to the second flexible layer. The first flexible layer may have electrical interconnect or other components for a driver backplane; the second flexible layer may have a fine interconnect deposited thereon; and a third flexible layer may have gross interconnect deposited thereon. The interconnect deposited onto the top surface and/or bottom surface of the flexible layer may be gross or fine depending upon the intended result that is to be achieved. Flexible layers (e.g., tape) may be comprised of a material selected from the group of polyether sulfone (PES), polyethylene terephthalate, polycarbonate, polybutylene terephthalate, polyphenylene sulfide (PPS), polypropylene, aramid, polyamide-imide (PAI), polyimide, nylon material (e.g., polyamide), aromatic polyimides, polyetherimide, metallic materials, acrylonitrile butadiene styrene, and polyvinyl choloride. Another embodiment relates to a rigid display comprised of multiple tape assembly described above.

Figure 1A:
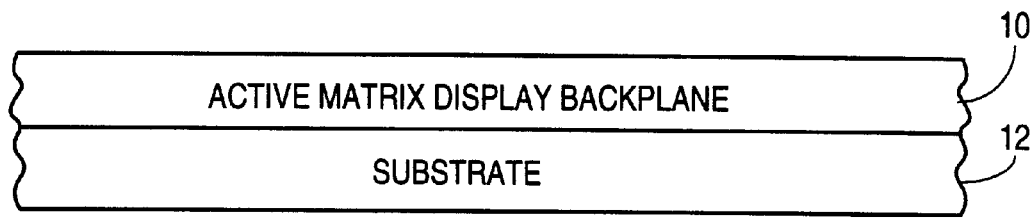
FIG. 1A shows a planar side view of an active matrix display backplane coupled to a rigid substrate.
Figure 1B:
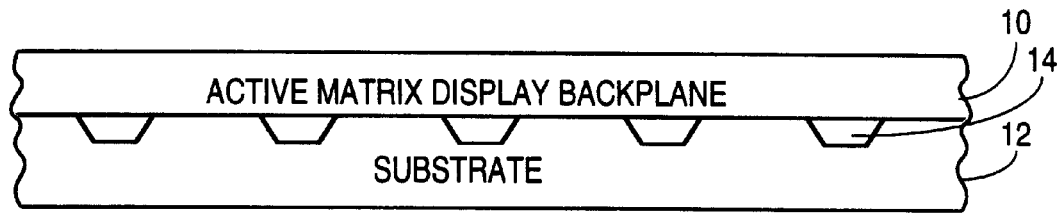
FIG. 1B shows a planar side view of an active matrix display backplane coupled to a rigid substrate wherein a plurality of blocks are part of the active matrix display.
Figure 1C:
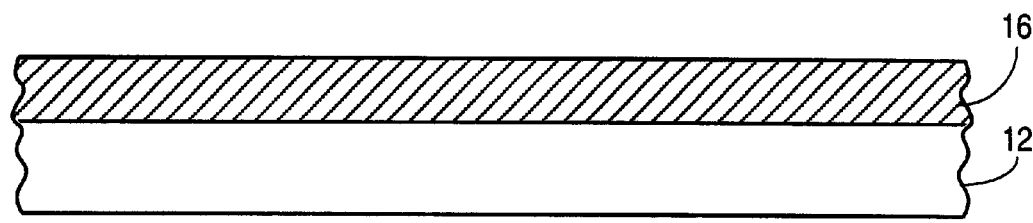
FIG. 1C shows a planar side view of a reflective display backplane coupled to a rigid substrate.
Figure 1D:
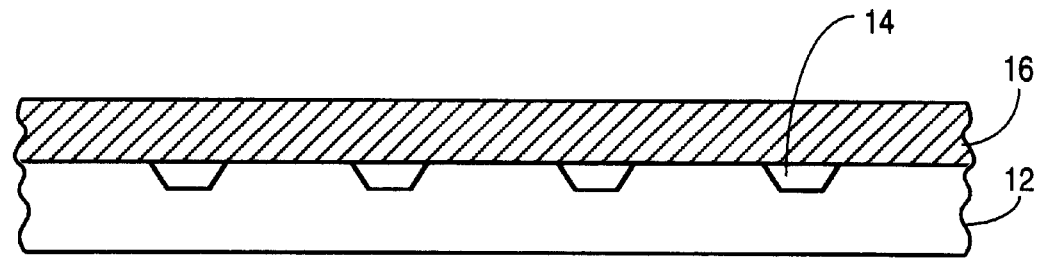
FIG. 1D shows a planar side view of a reflective display backplane coupled to a rigid substrate wherein a plurality of blocks are coupled to the reflective display and to the rigid substrate.
Figure 2:
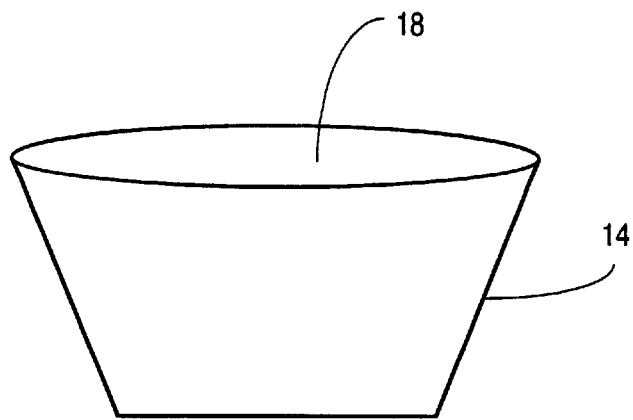
FIG. 2 shows a top perspective view of a circuit element block.
Figure 3:
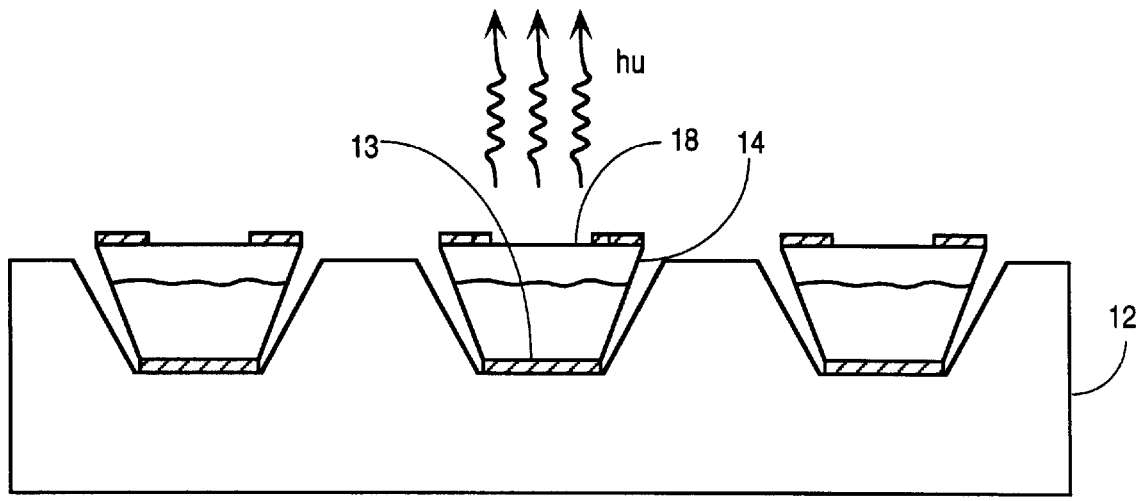
FIG. 3 shows a planar side view of blocks in recessed regions of the rigid substrate and a metalization surface on the blocks.
Figure 4:
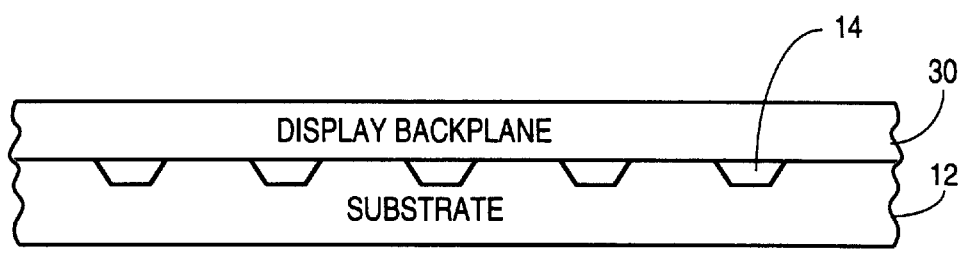
FIG. 4 shows a planar side view of a rigid substrate coupled to a rigid display backplane with a plurality of blocks between the display backplane and substrate.
Figure 5:
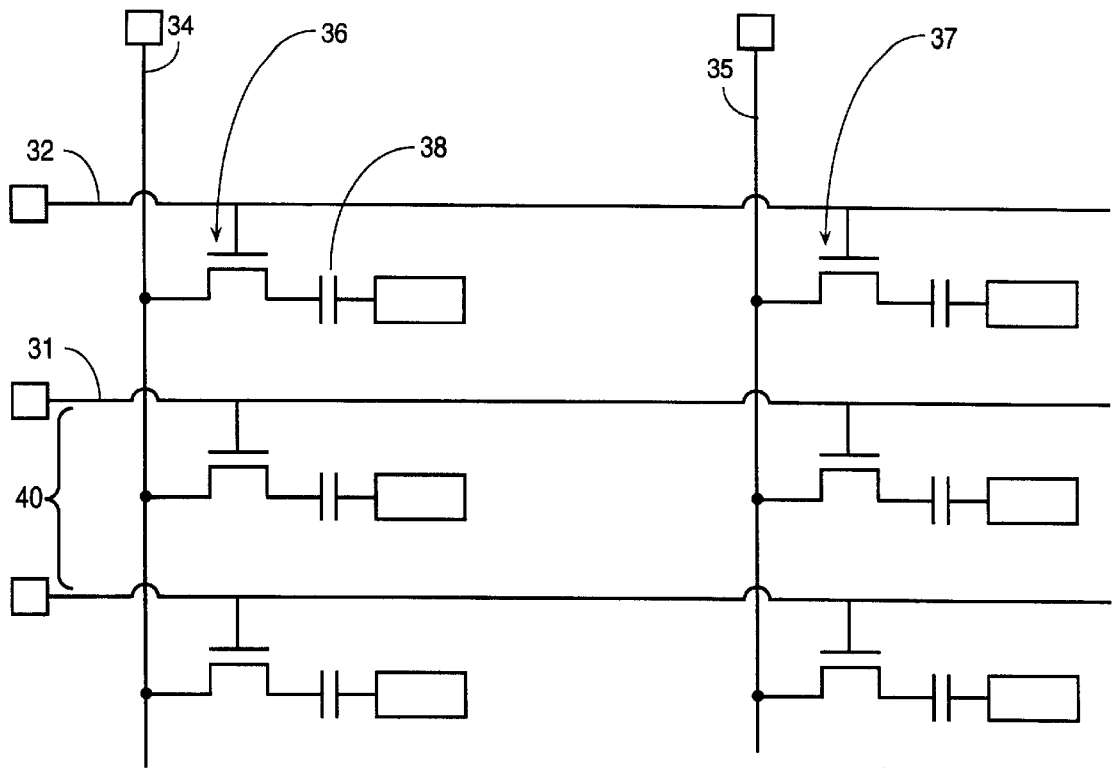
FIG. 5 schematically represents a portion of an array of an active matrix backplane.
Figure 6:
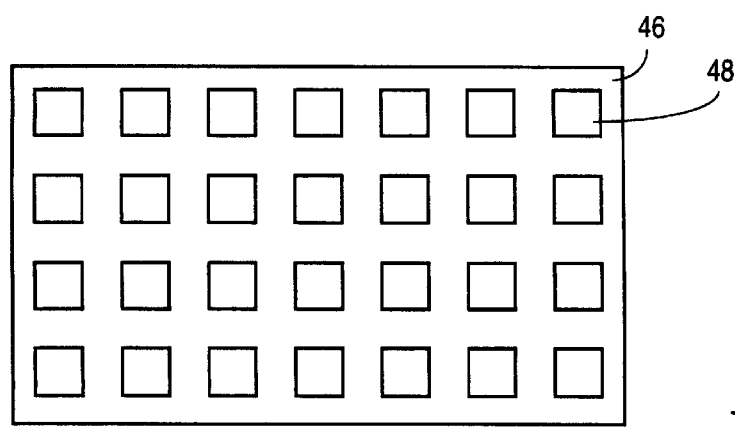
FIG. 6 shows a top view of a plurality of pixel electrodes in a backplane.
Figure 7A:
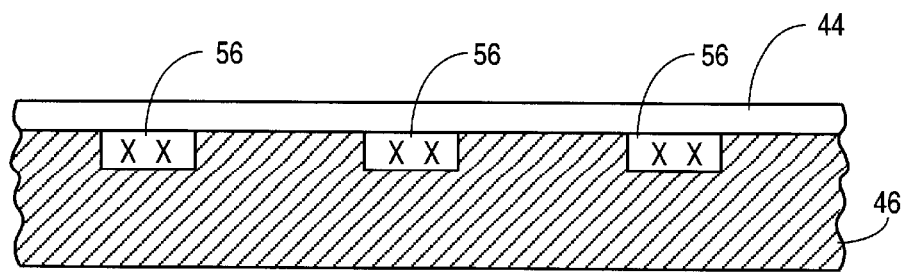
FIGS. 7A–7D show a reflective display with multiple flexible layers.
Figure 7B:
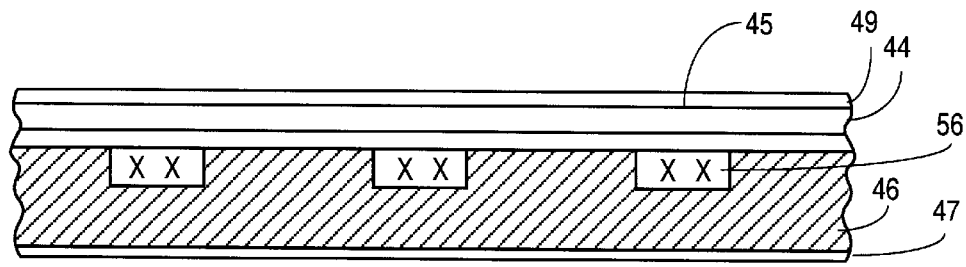

FIGS. 7A–7D show a display with multiple flexible layers. FIGS. 7A and 7B show a first flexible layer (e.g., tape) 44 coupled to a flexible substrate 46. The flexible substrate 46 includes blocks 56, each of which includes a functional component such as pixel driving circuit for a pixel in an active matrix liquid crystal display (LCD). The blocks 56 may be deposited on receiving regions (e.g., shaped regions or holes) in the substrate 46 through a process known as FSA (see U. S. Pat. No. 5,545,291). The blocks are contained in a slurry which is deposited onto a flexible (or rigid) substrate. Although blocks may be comprised of single crystal silicon or other like material which makes the block rigid, a flexible substrate may still be flexible because the size of these blocks (50×100 microns or 100×100 microns) is small in comparison to the flexible substrate. Flexible substrate forms part of a display backplane. The flexible displays may be either an active matrix or a passive matrix displays. Once deposited onto the substrate, the blocks are coupled to pixel electrodes and to row and column interconnects in order to create an active matrix backplane which includes an array of pixel electrodes.

Figure 7C:
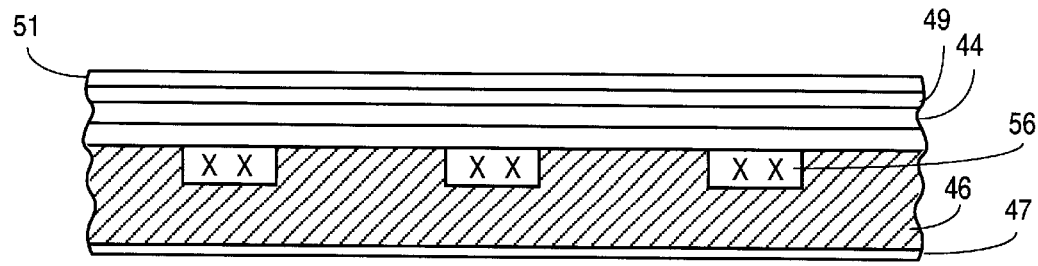
Figure 7D:
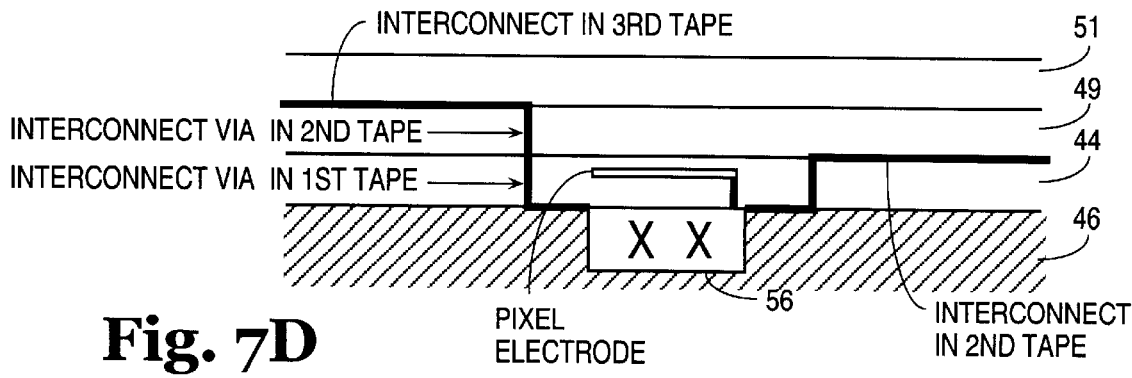

The first flexible layer 44 may in this embodiment include transparent pixel electrodes and the transparent interconnects for coupling each pixel electrode to its respective interconnect on its respective block. Thus, the first flexible layer 44 in this embodiment includes the pixel electrodes which are electrically coupled to their respective driver block 56 and this layer 44 will also include an interconnect via which will allow electrical connections between the underlying blocks 56 and layers above the layer 44, such as layers 49 and 51. The layers 49 and 51 may include other electrical interconnects, such as the row and column lines in an active matrix display backplane. For example, the flexible layer 49 may include row interconnects, each row interconnect for coupling to a gate electrode of a transistor in block 56 through an interconnect via in layer 44. The flexible layer 51 may include column interconnects, each column interconnect for coupling to an electrode (e.g., source electrode) of a transistor in block 56 through interconnect vias in the layers 49 and 44. The flexible substrate may be comprised of plastic, silicon, glass or other material that is flexible. FIG. 7B shows a second flexible layer 49 with fine electrical interconnect 45 sequentially coupled to a first flexible layer 44. Electrical interconnect layers can generally be comprised of aluminum, copper, gold, conductive organic compounds, or other metallic material (in the case of transparent interconnects or electrodes, indium tin oxide may be used). Coupled to the flexible substrate is a flexible reflector 47 if the display is a reflective type of display; if the display is transmissive, then no reflector is normally used. The substrate 46 is coupled to a first flexible layer 44; a second flexible layer 49 having a fine interconnect is coupled to the first flexible layer; and a third flexible layer 51 is coupled to the second flexible layer 49 as shown in FIG. 7C. FIG. 7D shows the assembly of multiple flexible layers on substrate 46 including first flexible layer 44 wherein interconnect is deposited therein. The first flexible layer or tape 44 includes a pixel electrode, wired to block 56 through a via in tape 44, and also includes conductive layers between the tape 44 and the substrate 46. These conductive layers serve as electrical interconnects from a circuit(s) in block 56 to other electrical components. These conductive layers carry signals to/from block 56 through vias in tape 44 to the other electrical components. The second tape 49 includes a conductive layer between the tape 49 and tape 44 as shown in FIG. 7D; this conductive layer between tapes 49 and 44 electrically couples another circuit element (not shown) to block 56 through the layer between tapes 49 and 44 and the via in tape 44 and the layer between tape 44 and substrate 46 as shown in FIG. 7D. The third tape 51 includes a conductive layer between the tape 51 and tape 49; this conductive layer is coupled to the block 56 through a conductive via (a vertical conductor) in tape 49 and a conductor via in tape 44 as shown in FIG. 7D. Each of these tapes and their conductive layers may be separately fabricated and then sequentially deposited on onto each other and then applied to the substrate, or the first tape may be applied to the substrate first and then the second tape and finally the third tape. The conductive layers and vias (with vertical conductors) may be created by various known techniques for applying conductive films and patterning these films onto surfaces or in vias. The pattern created in these films may be used to determine the electrical interconnections, such as row and column interconnects in an active matrix display. First flexible layer 44 is coupled to second type 49 wherein interconnect is deposited therein. Second flexible layer 49 is coupled to third flexible layer 51 wherein interconnect is deposited therein.

The substrate 46 and its three layers 44, 49 and 51, after assembly, form an active matrix backplane which may be assembled with a light source (for a transmissive display, or a reflector for a reflective display) and a spatial light modulating medium such as a liquid crystal layer and a polarizing film or films in order to create a display assembly such as an active matrix LCD.

In another embodiment of the example shown in FIGS. 7A–7D, the flexible layer 44 may provide all the necessary interconnects for forming an active display backplane with the blocks 56, and layers 49 and 51 may each be color filters (or layer 49 may be a layer containing the spatial light modulating medium (e.g., a polymer dispersed liquid crystal) and layer 51 may be a light filter such as a polarizer).

Figure 8A:
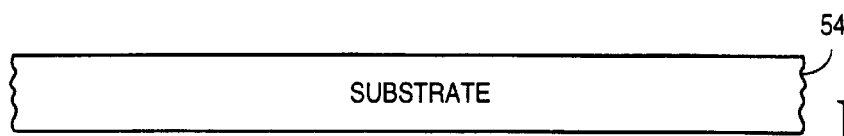
FIG. 8A shows a planar side view of a flexible substrate.
Figure 8B:
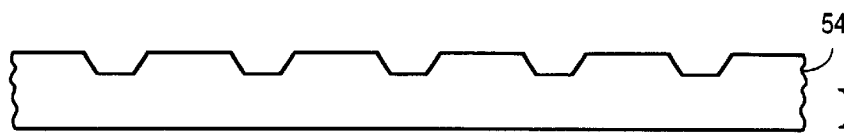
FIG. 8B shows recessed regions created in a flexible substrate.
Figure 8C:
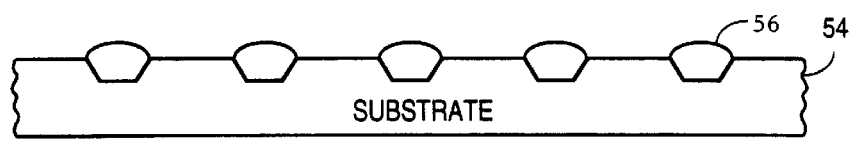
FIG. 8C shows a plurality of blocks which are formed on the flexible substrate.
Figure 8D:
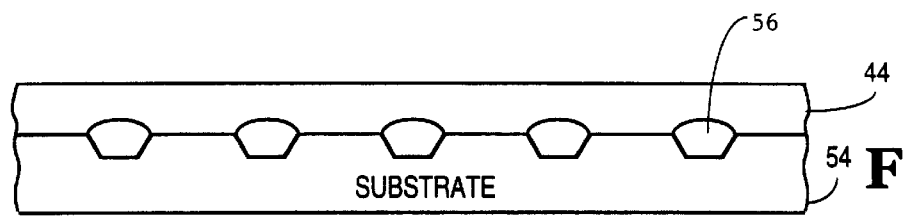
FIG. 8D shows a first flexible layer coupled to the flexible substrate. The first flexible layer also has in one embodiment a display plane coupled thereto.
Figure 8E:
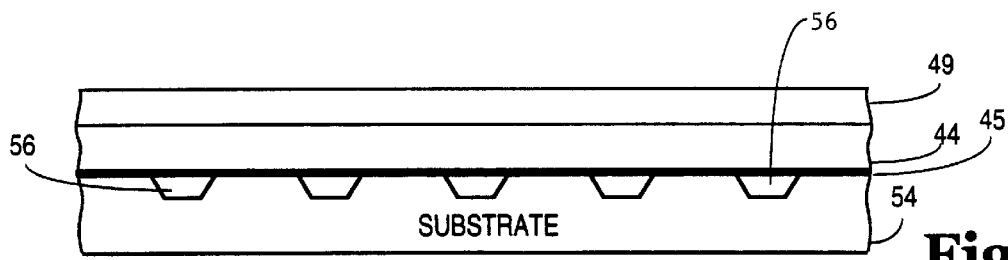
FIG. 8E shows a second flexible layer with fine interconnect layer deposited onto one side of the second flexible layer. This second flexible layer is coupled to the first flexible layer of the device shown in FIG. 8D.
Figure 8F:
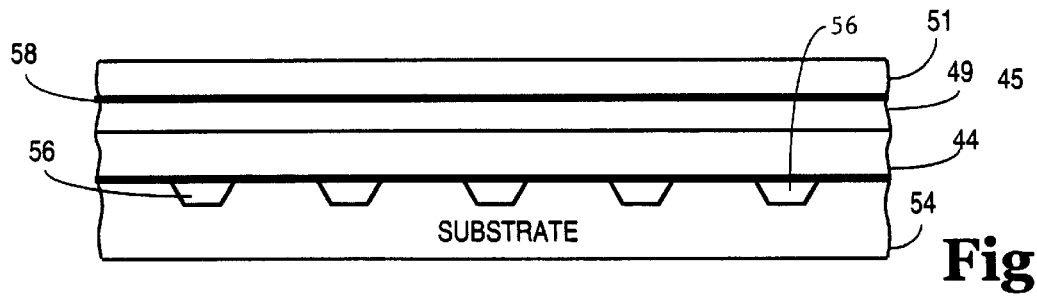
FIG. 8F shows gross interconnect layer deposited onto the third flexible layer. This third flexible layer is coupled to the second flexible layer of the device shown in FIG. 8E.

FIGS. 8A–8F show an assembly of a flexible display with multiple layers according to another exemplary embodiment. FIG. 8A shows a planar side view of a flexible substrate 54. FIG. 8B shows recessed regions created in a flexible substrate 54. These recessed regions may be created in a manner described in U. S. Pat. No. 5,545,291. FIG. 8C shows a plurality of blocks 56 are formed on the flexible substrate 54 (e.g., blocks were deposited into the recessed regions through as FSA process). FIG. 8D shows a first flexible layer 44 coupled to the flexible substrate. The first flexible layer 44 has a display plane coupled thereto. FIG. 8E shows a second flexible layer 49 with fine interconnect layer 45 deposited onto one side of the second flexible layer 49. This second flexible layer 49 is coupled to the first flexible layer 44. FIG. 8F shows gross interconnect layer 58 deposited onto the second flexible layer 49. This third flexible layer 51 is coupled to the second flexible layer 49.

Figure 9A:
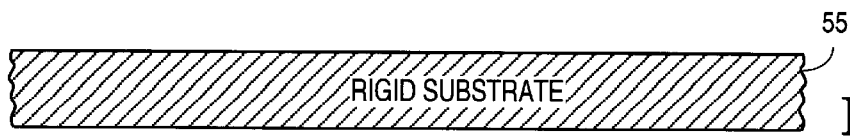
FIGS. 9A–9F show the same devices as those shown in FIGS. 8A–8F except a rigid substrate is used instead of a flexible substrate.
Figure 9B:
Figure 9C:
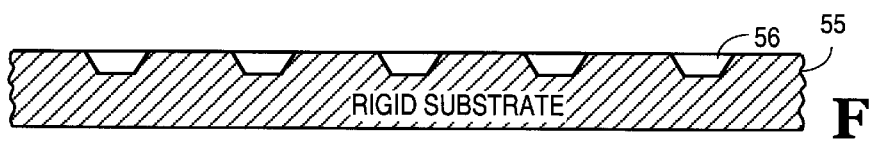
Figure 9D:
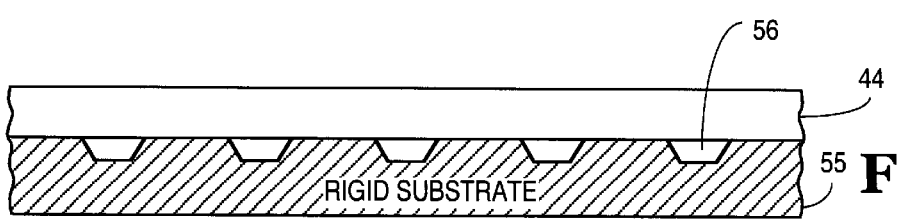
Figure 9E:
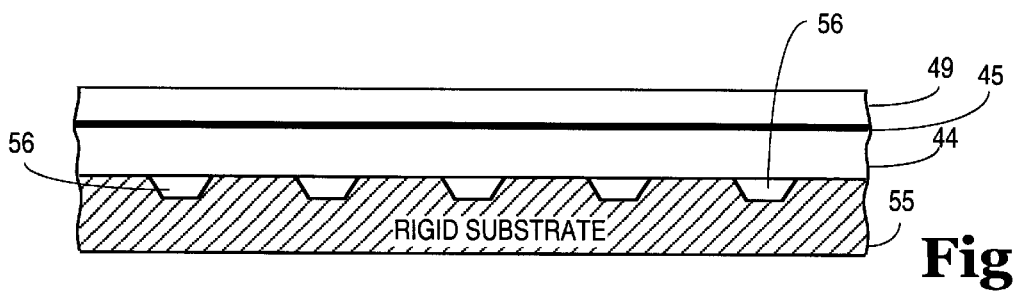
Figure 9F:
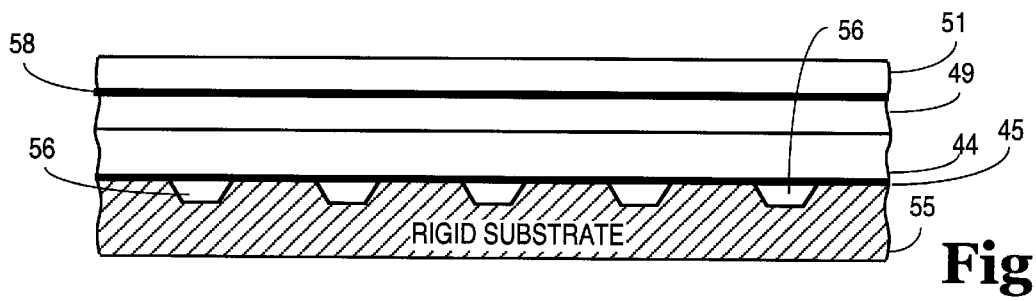

FIGS. 9A–9F show an assembly of a display using a rigid substrate with multiple layers. FIG. 9A shows a planar side view of a rigid substrate 55. FIG. 9B shows recessed regions created in a rigid substrate 55. FIG. 9C shows a plurality of blocks 56 are formed on the rigid substrate 55. FIG. 9D shows a first flexible layer 44 coupled to the rigid substrate 55. The first flexible layer 44 has a display plane coupled thereto. FIG. 9E shows a second flexible layer 49 with fine interconnect layer 45 deposited onto one side of the second flexible layer 49. This second flexible layer 49 is coupled to the first flexible layer 44. FIG. 9F shows gross interconnect layer 58 deposited onto the second flexible layer 49. This third flexible layer 51 is coupled to the second flexible layer 49.

Alternatively, embodiments to FIGS. 7A–7D, 8A–8F, and 9A–9F have the gross interconnect on the second flexible layer and a fine interconnect on the third flexible layer.

Figure 10:
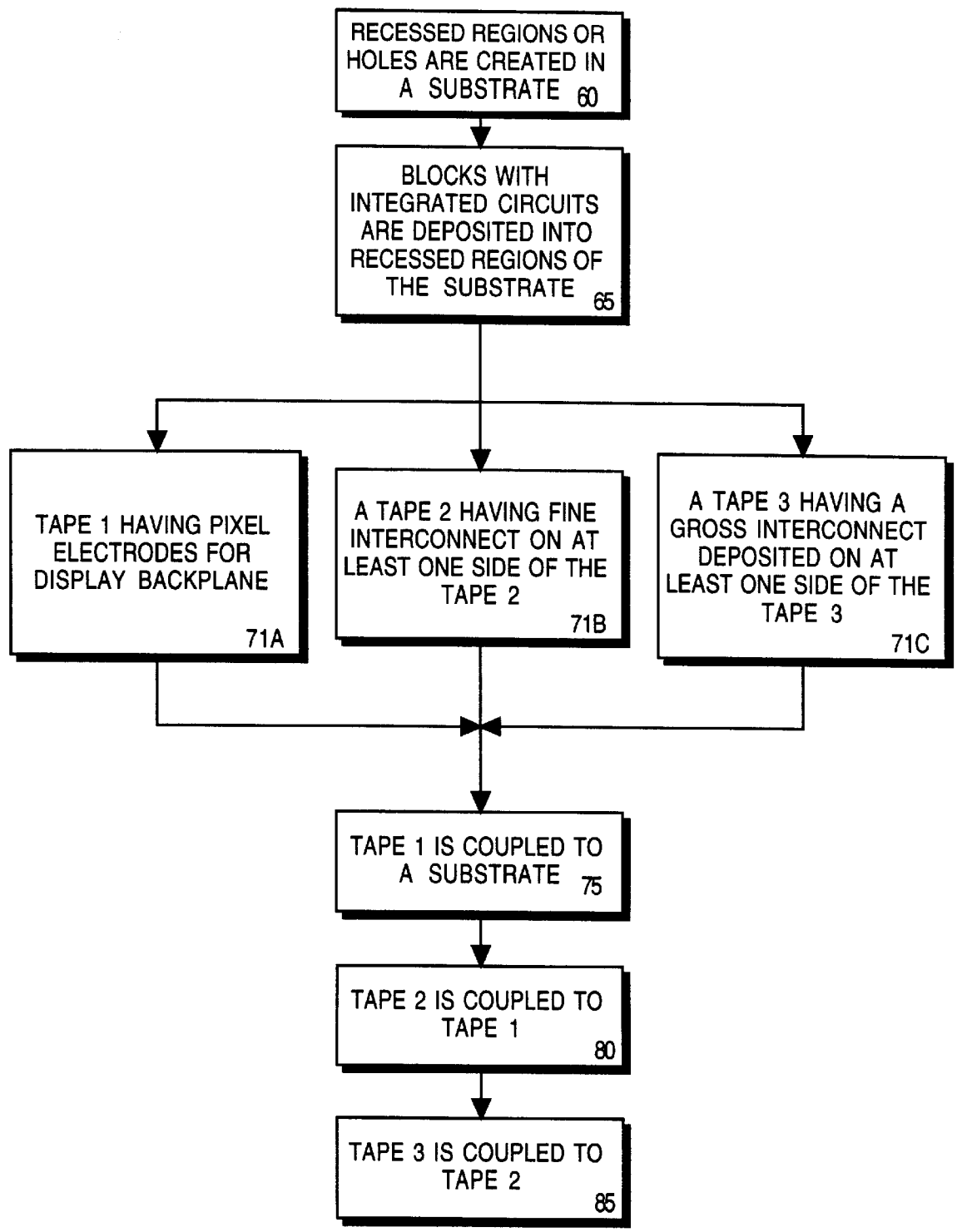
FIG. 10 schematically shows the steps to assembling a multiple modular assembly.

FIG. 10 shows a method for the fabrication of a multiple layer modular assembly according to one exemplary embodiment. In operations 60 and 65, blocks are assembled into recessed regions of a substrate. Flexible layers may be then coupled to the substrate. Coupling may include embodiments wherein an intervening layer (e.g., an LC layer) is between at least two flexible layers or tapes. Each flexible layer may be separately processed before coupling to the substrate. The first flexible layer has elements of a display backplane attached thereto in operation 71A. The second flexible layer 49 has a fine interconnect 45 deposited on at least one side of the second flexible layer in operation 71B. The third flexible layer 51 has gross interconnect 58 deposited thereon in operation 71C.

After the plurality of blocks have been electrically coupled, and the flexible layer with display backplane is coupled to the substrate; the second flexible layer 49 with fine interconnect 45 is coupled to the first flexible layer 44. The third flexible layer 51 is then coupled to the second flexible layer 49. Alternatively, the second and third flexible layers could be coupled and then these flexible layers could then be coupled to a substrate.

Figure 11:
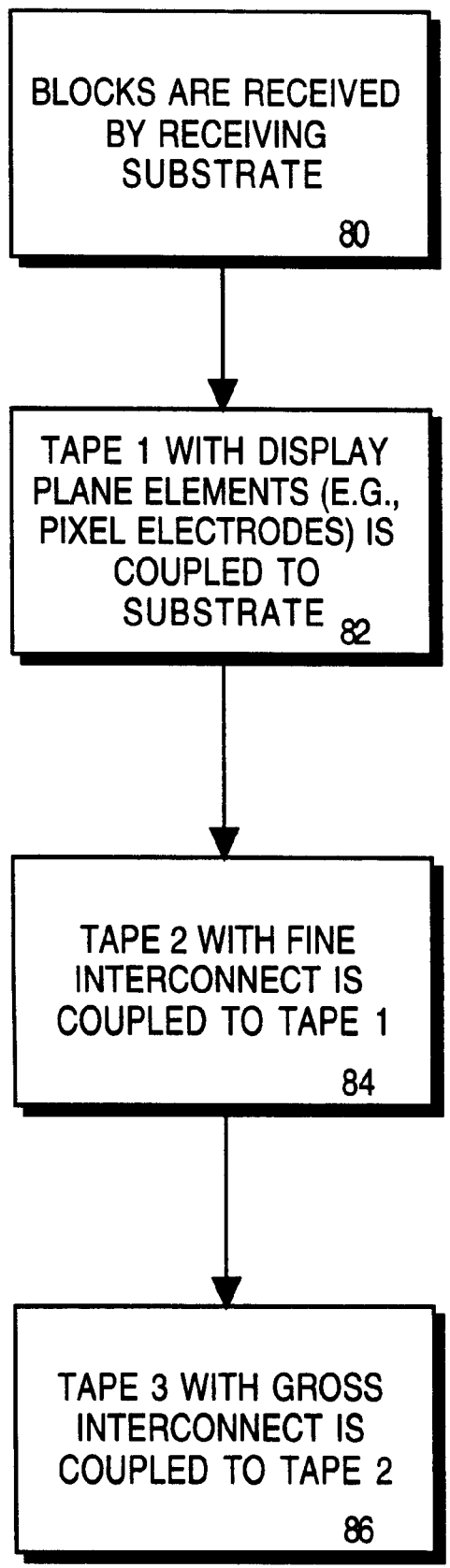
FIG. 11 shows the assembly of a display that has multiple flexible layers and at least one flexible layer has an electrical interconnect on at least one side.

FIG. 11 is a flowchart which illustrates a generalized method of forming an assembly in which shaped blocks are received by openings in a receiving substrate and multiple flexible layers with interconnect are coupled sequentially to the substrate in order to create a final assembled structure. In one embodiment of the invention, recessed regions or holes are created in the substrate at operation 80. This is to allow blocks with integrated circuits thereon to be coupled to the substrate. The substrate may be either flexible or rigid. Rigid materials may be comprised of glass or rigid plastics. The first flexible layer 44 with a display plane is coupled to the substrate at operation 82. The second flexible layer 49 with fine interconnect 45 deposited on one side is coupled to the first flexible layer at operation 84. The third flexible layer 51 is then coupled to the second flexible layer at operation 86. It should be noted that coupling may include embodiments wherein an intervening layer (e.g., a layer/tape with PDLC) is between at least two flexible layers.

Figure 12A:
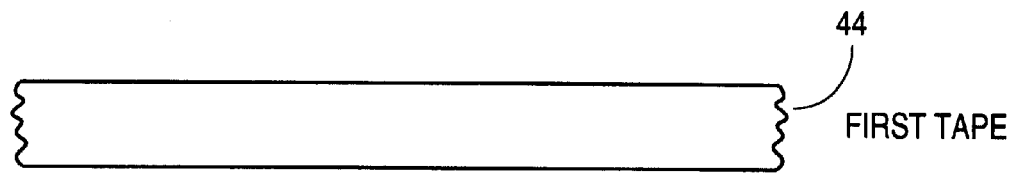
FIGS. 12A–12B show planar side views of a first flexible layer with a display backplane.
Figure 12B:
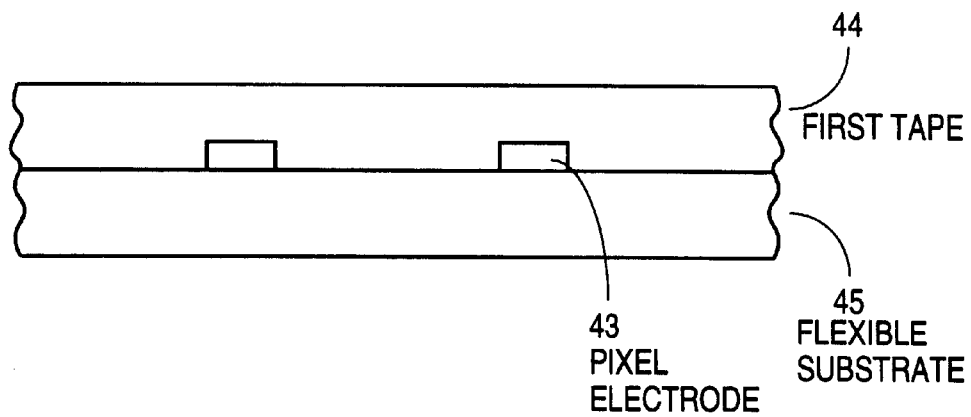

FIG. 12A shows a first flexible layer 44 before depositing blocks, such as blocks 43 which may contain a pixel electrode. FIG. 12B shows a first flexible layer 44 having components of a display backplane such as blocks coupled to a flexible substrate.

Figure 13A:
FIGS. 13A–13B show planar side views of a second flexible layer with fine interconnect deposited thereon.
Figure 13B:
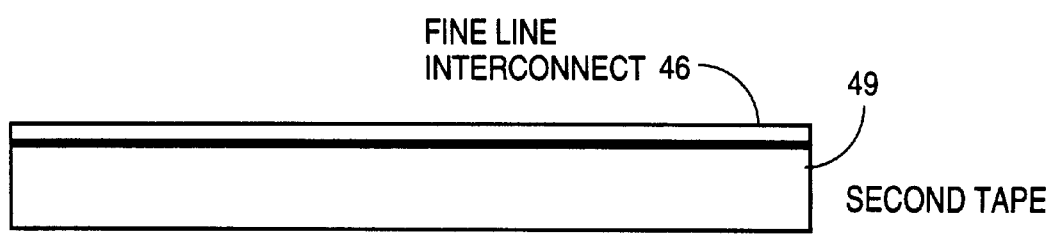

FIG. 13A shows a second flexible layer 49 that may be prepared through a process separate from the substrate and the first flexible layer 44. FIG. 13B shows a fine interconnect 46 deposited onto the second flexible layer 49. The methods used to deposit a fine interconnect 45 onto the second flexible layer 49 are discussed below.

Figure 14A:
FIGS. 14A–14B show planar side views of a third flexible layer with a gross interconnect.
Figure 14B:
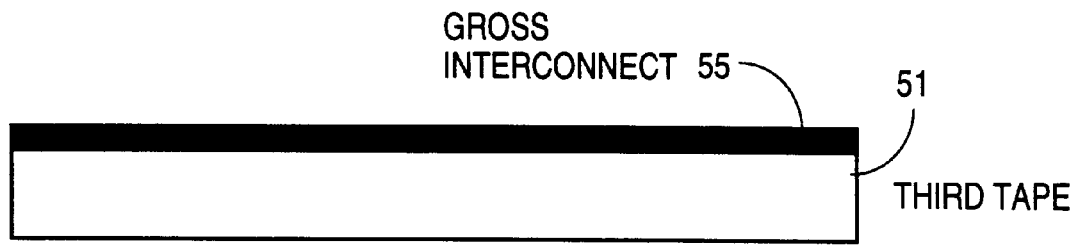

FIG. 14A shows a third flexible layer 51 that may be prepared through a process that may be separate from the processing of the substrate and the other flexible layers. FIG. 14B shows gross interconnect 58 deposited onto the second flexible layer 49. The methods used to deposit a gross interconnect onto the third flexible layer 51 is discussed below.

Figure 15A:
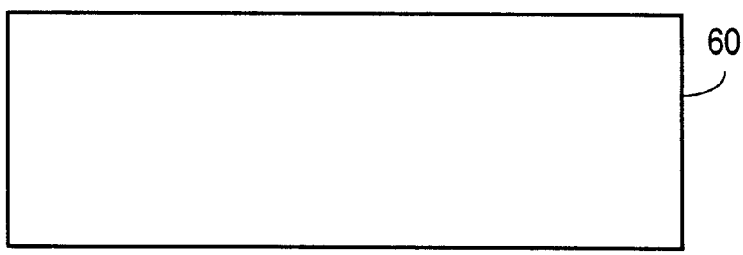
FIGS. 15A–15D show another embodiment of the invention wherein conductive layers are sequentially assembled on a single side of the display.
Figure 15B:
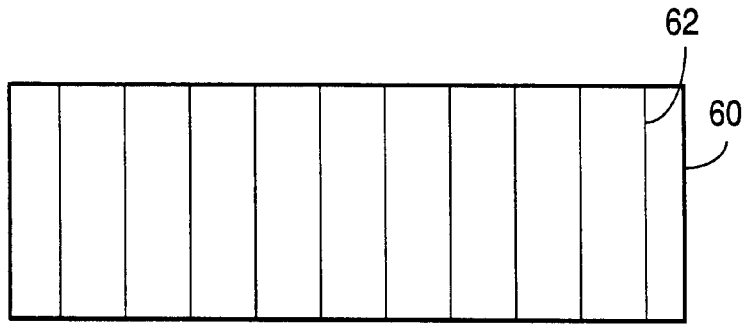
Figure 15C:
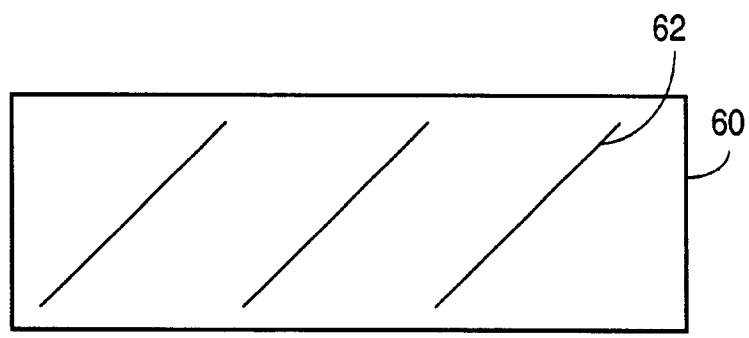
Figure 15D:
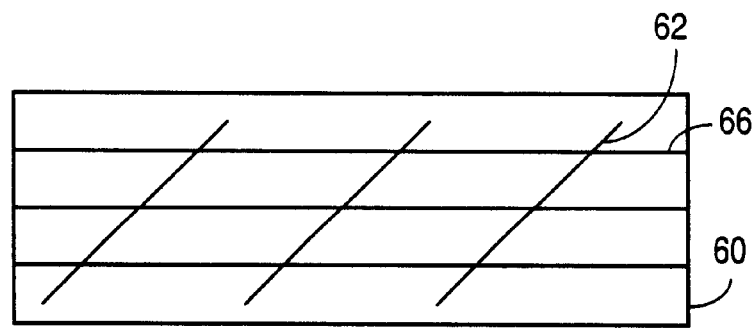

FIGS. 15A–15D show another embodiment of the invention wherein conductive layers are sequentially assembled on a single side of a display. FIG. 15A shows a first flexible layer 60 without interconnect. FIG. 15B shows interconnect 62 deposited along a y-axis of a first flexible layer 60. FIG. 15C shows a layer of dielectric 64 deposited onto the first flexible layer 60. FIG. 15D shows a second interconnect layer 66 deposited onto the first flexible layer. This assembly may be used in combination with any of the flexible layers described in the embodiments herein. For example, this first flexible layer may be coupled to the substrate with the blocks and to a second flexible layer that does not have interconnect facing the first flexible layer.

Figure 16A:
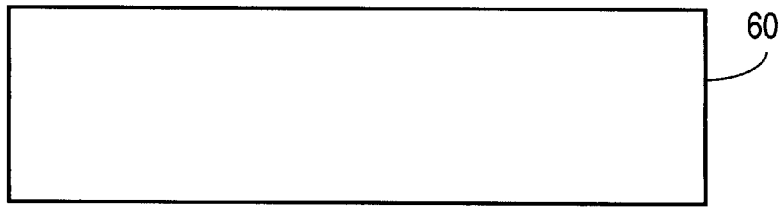
FIGS. 16A–16D show planar side views of the embodiment of FIGS. 15A–15D.
Figure 16B:
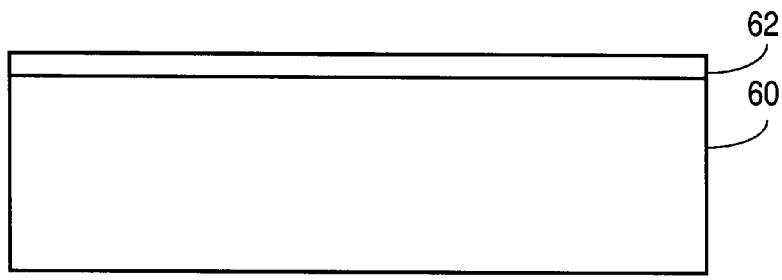
Figure 16C:
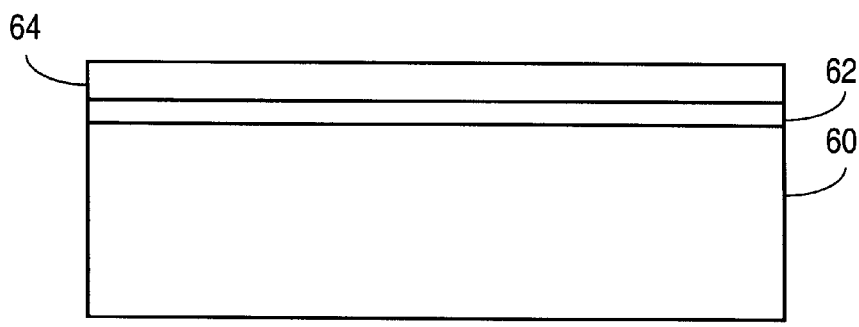
Figure 16D:
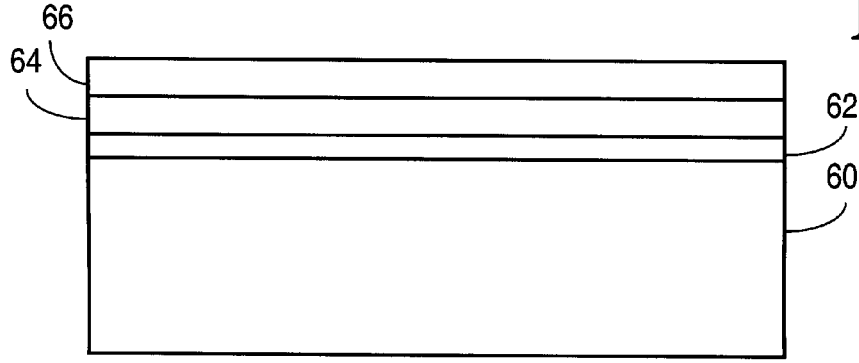

FIGS. 16A–16D show planar side views of the embodiment of FIGS. 15A–15D. FIG. 16A shows a flexible layer 60 without interconnect. FIG. 16B shows one layer of interconnect 62 deposited on the flexible layer. FIG. 16C shows dielectric layer 64 deposited onto flexible layer 60. FIG. 16D shows a second interconnect layer 66 deposited onto the dielectric layer 64.

Although a flexible layer is described in FIGS. 15A–15D and FIGS. 16A–16D, a rigid substrate may work equally well. The rigid substrate may be comprised of glass, borosilicate glass, soda lime glass, or quartz.

Figure 17A:
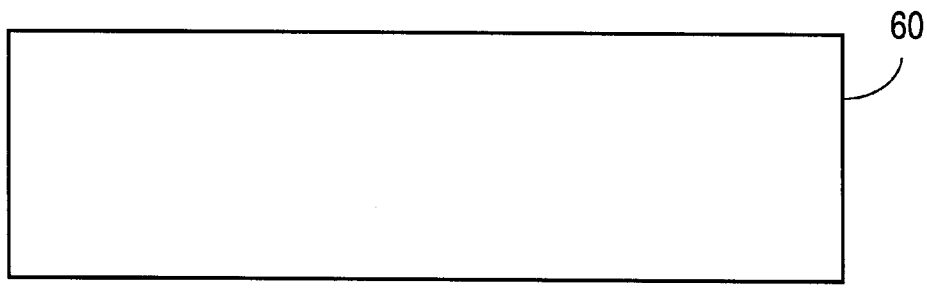
FIGS. 17A–17C show a flexible layer having a top surface and a bottom surface wherein interconnect is deposited thereon.
Figure 17B:
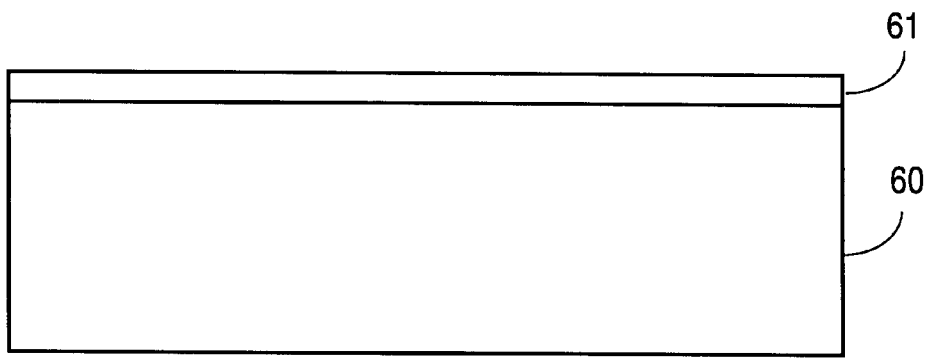
Figure 17C:
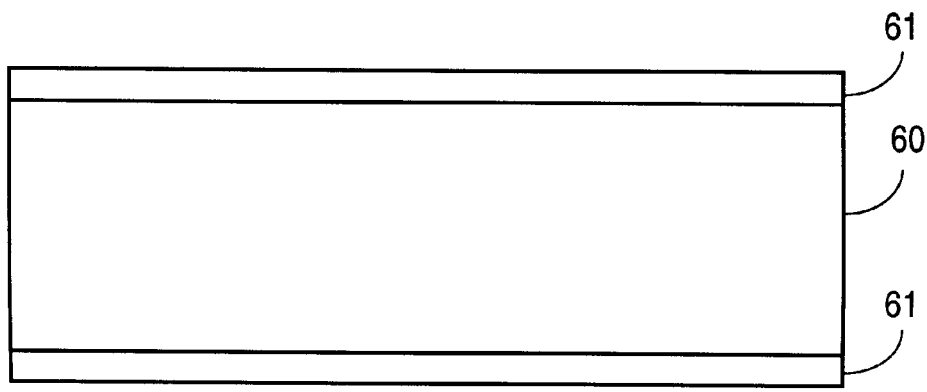

FIGS. 17A–17C show a flexible layer having a top surface and a bottom surface wherein interconnect is deposited thereon. FIG. 17A shows first flexible layer 60 without interconnect. FIG. 17B shows interconnect 61 deposited onto the top surface of the first flexible layer. FIG. 17C shows interconnect 61 deposited on the bottom surface of the first flexible layer.

Figure 18:
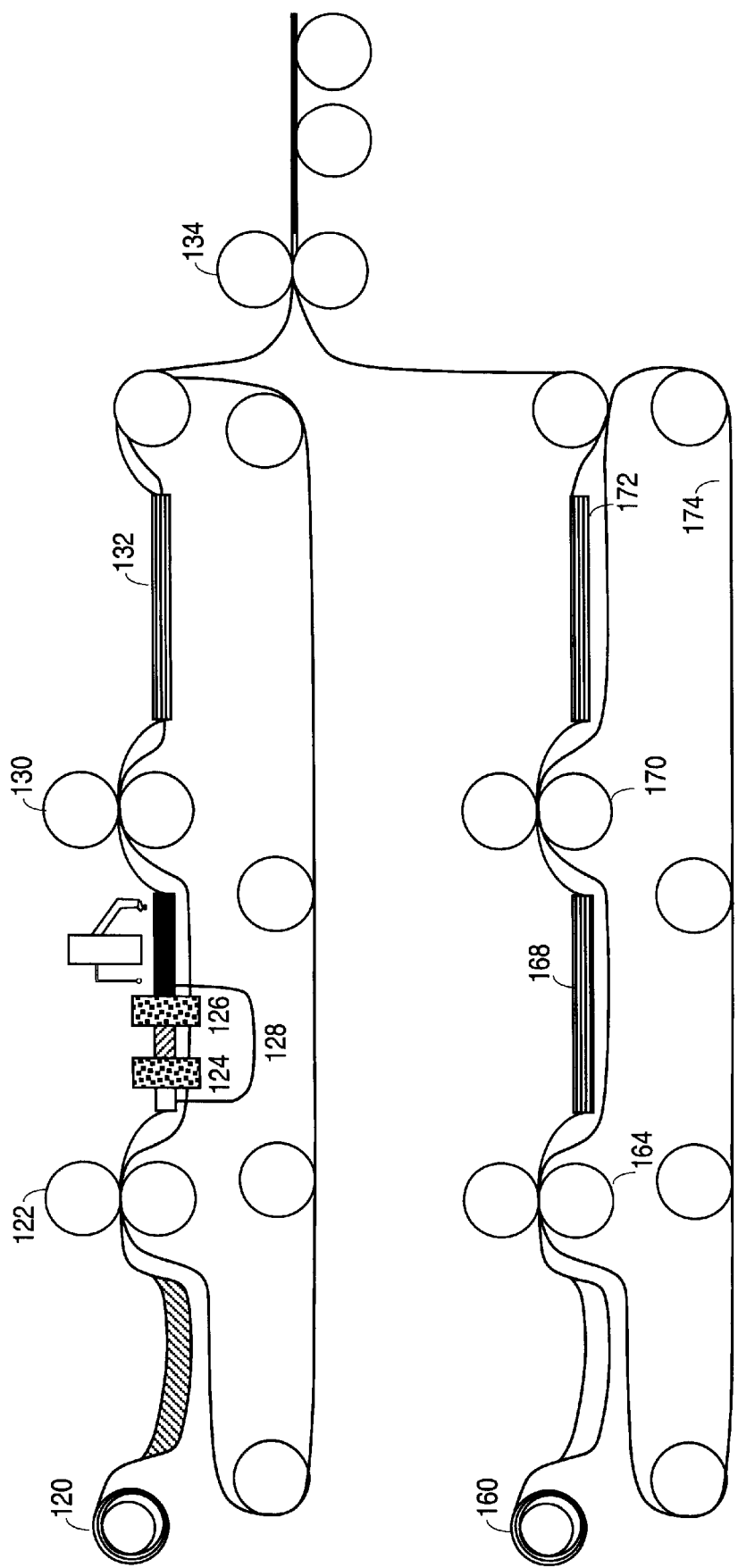
FIG. 18 shows an embodiment of the overall in-line process of the invention.

FIG. 18 shows an embodiment of the overall in-line process of the invention. A web apparatus machine 119 is used to process the substrate and the flexible layers. At operation 120, apertures are created in the flexible substrate. These apertures can be created by a number of methods. For example, the apertures can be punched into the substrate. Another method involves using a template to create the apertures. A laser could also be used to create the apertures. The substrate advances over a plurality of support members 122. In this embodiment, the FSA process is applied to the substrate but it should be noted that the FSA can also be applied to tape. FSA comprises a slurry that contains a plurality of functional blocks. These blocks have, in one embodiment, a circuit element (not shown) that drives the picture element (not shown). The FSA process occurs at operation 124. It is then applied again at 126. The excess slurry is collected in container at operation 128. Then, the flexible substrate advances through support members 130. The flexible substrate advances over a guide member and meets at a point 134 wherein it is coupled to multiple flexible layers. A different portion of the process (not shown) involves fabricating the first flexible layer, the second flexible layer, and the third flexible layer. Before the flexible layers are coupled with the substrate, the flexible layers go through their own separate process. For example, the first flexible layer has components of a display backplane attached thereto; the second flexible layer has a fine interconnect deposited on at least one side of the second flexible layer; and a gross interconnect is deposited onto at least one side of the third flexible layer.

There are a variety of methods of depositing interconnect and display material onto flexible layer. For example, display material may be sprayed onto the flexible layer. The display material also may be placed on a screen over the flexible layer. Another method is to place the flexible layer into a container that holds the display material. The flexible layer advances through support members 164. The flexible layer then has display material layered or patterned on the flexible layer at 168. This flexible layer then advances through another plurality of support members 170. A metal interconnect is then deposited or etched onto the flexible layer 172. This interconnect may be fine or gross. This may be performed by inkjet, lithography and etch, screen print, laser etch, or deposit. In one embodiment of the invention, this large interconnect is a cover glass electrode. At point 134, the display flexible layer is coupled with a substrate.

Figure 19:
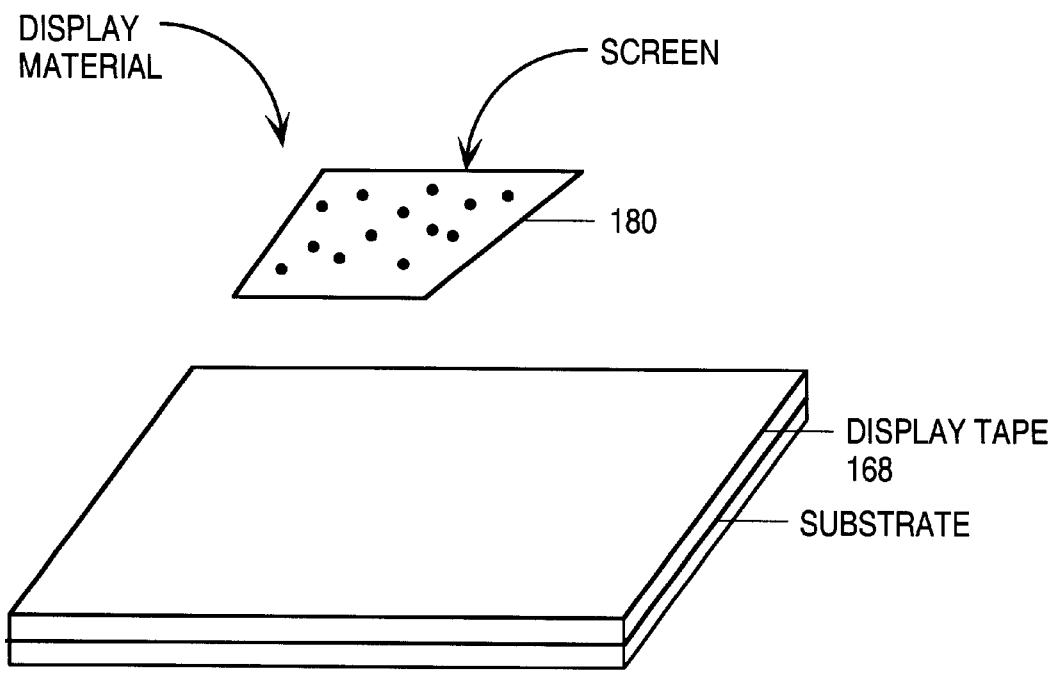
FIG. 19 shows a display material being placed through a screen onto flexible layer.

FIG. 19 shows a display material being placed through a screen 180 onto flexible layer 168. The screen 180 has a desired pattern created by holes that go through the screen 180. This desired pattern may be dictated by a customer or by the manufacturer.

Figure 20:
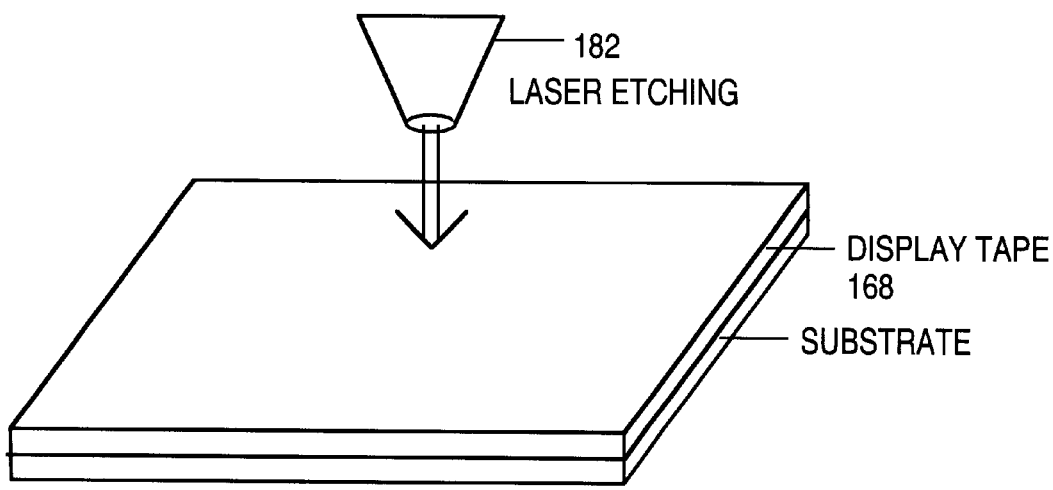
FIG. 20 shows a top view of display material being laser etched onto flexible layer.

Another method of placing display material onto the flexible layer is shown in FIG. 20. FIG. 20 shows a top view of display material being laser etched onto display flexible layer 168. The etching occurs when the high intensity light from the laser 182 strikes the display material on top of the display flexible layer 168. A pattern is created in the display material by the laser 182.

Figure 21:
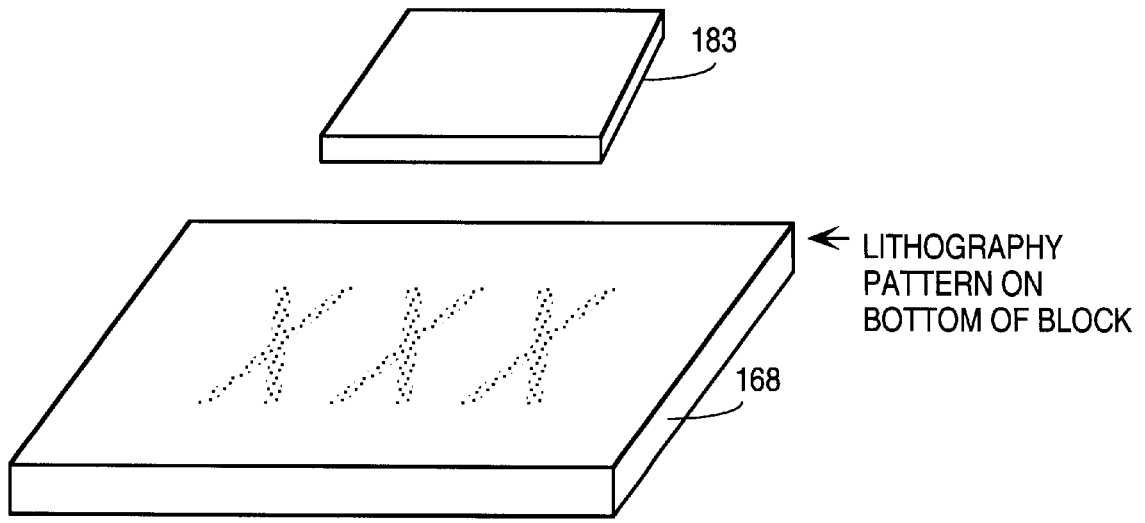
FIG. 21 shows lithography being used to pattern the display material.

Another method of depositing display material is shown in FIG. 21. FIG. 21 shows lithography being used to pattern the display material. Lithography involves using a block 183 with a pattern engraved in the bottom surface of the block 183. The bottom surface of the block 183 contacts the display material.

Figure 22:
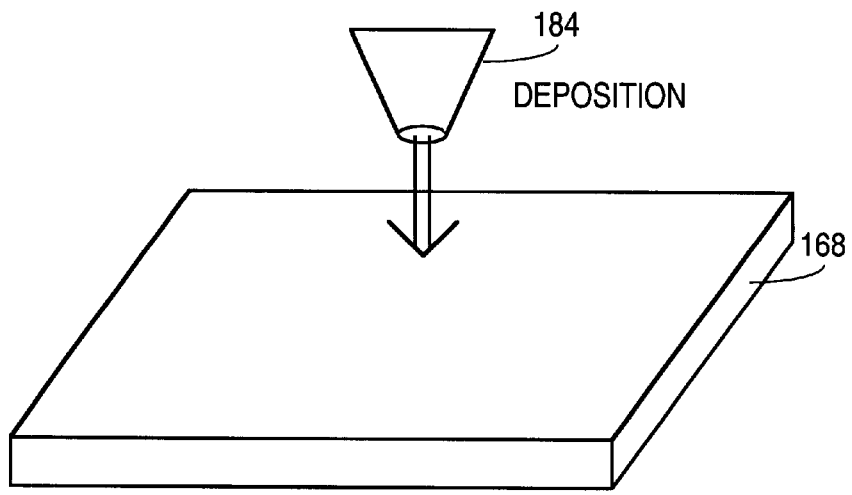
FIG. 22 shows display material being deposited by a container onto the flexible layer.

FIG. 22 shows yet another method of depositing display material onto the flexible layer. There display material is deposited in a pattern onto the flexible layer 168. The display material is deposited by a container 184 that contains the display material. The container 184 is placed over the flexible layer 168. The display material drops onto the flexible layer 168 in a pattern.

Figure 23A:
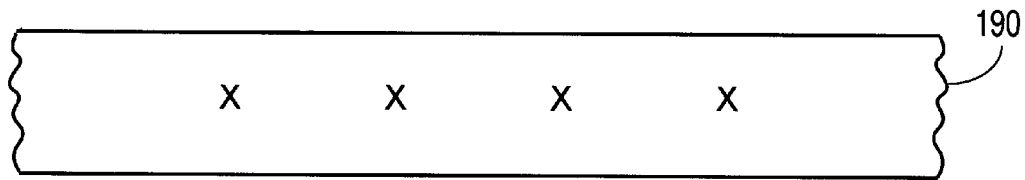
FIGS. 23A–23D shows generally the process of planarization material being added onto the substrate.
Figure 23B:
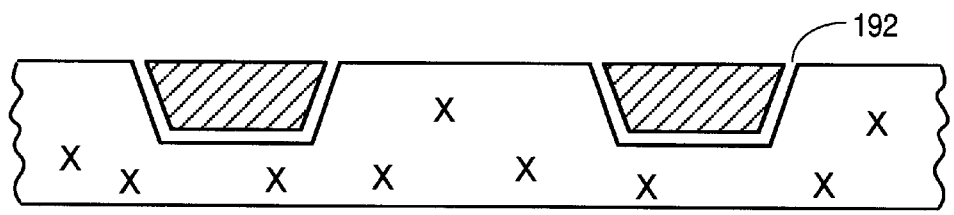
Figure 23C:
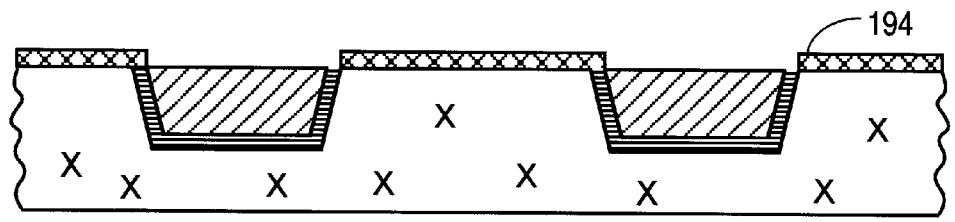
Figure 23D:
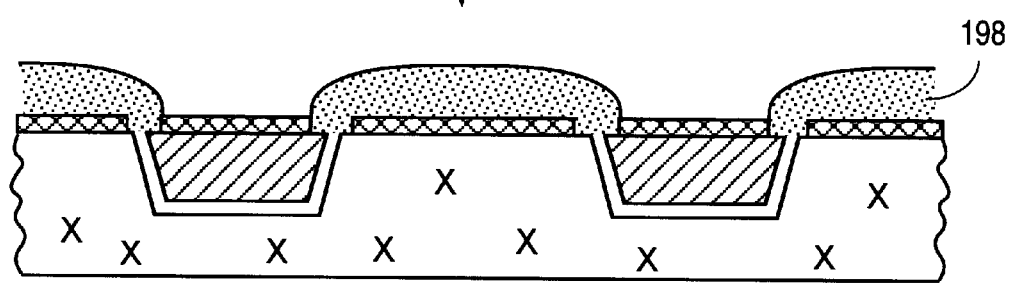

FIGS. 23A–23D shows generally the process of planarization material being added onto the substrate. FIG. 23A shows a planar side view of a substrate 190. FIG. 23B shows openings or receptor regions 192 created and blocks deposited into the substrate. FIG. 23C shows deposition of planarization material 194 and openings being created into the substrate. FIG. 23D shows deposition of interconnect 198 and pattern interconnect.

While an array of components (e.g. display components) for an assembly have been described as examples of the invention, an array of other assemblies such as x-ray detectors, radar detectors, micro-electro-mechanical structural elements (MEMS) or, generally, an assembly of sensors or actuators or an assembly of circuit elements also may be produced using the claimed invention. Thus, for example, flexible antennas, other sensors, detectors, or an array of circuit elements may be fabricated using one of the embodiments of the inventions. Other aspects and methods of the present invention as well as apparatuses formed using these methods are described further below in conjunction with the following figures.

Listed below are related U.S. Patent Applications that describe various improvements to the methods and devices of the invention described herein. These patent applications and a U.S. Patent are incorporated by reference.

Co-pending U.S. patent application Ser. No. 09/270,146, entitled "Apparatuses and Methods for Forming Assemblies,", filed by Jeffrey J. Jacobsen and assigned to the same Assignee as the present invention, describes a method and apparatus of assembling flexible displays. This co-pending application is hereby incorporated herein by reference.

Co-pending U.S. patent application Ser. No. 09/270,157, entitled "Methods for Transferring Elements From A Template To A Substrate", filed by Jeffrey J. Jacobsen, Mark A. Hadley, and John Stephen Smith and assigned to the same Assignee of the present invention, describe an FSA on a template with transfer to another substrate. These co-pending applications are hereby incorporated herein by reference.

Co-pending U.S. patent application Ser. No. 09/270,147, entitled "Apparatuses and Methods Used in Forming Electronic Assemblies", filed by Jeffrey J. Jacobsen, Glenn Wilhelm Gengel, and John Stephen Smith and assigned to the same Assignee as the present invention, describes a method of molding substances. This co-pending application is hereby incorporated herein by reference.

Co-pending U.S. patent application Ser. No. 09/268,755, entitled "Web Process Interconnect in Electronic Assemblies", filed by Jeffrey J. Jacobsen, Glenn Wilhelm Gengel, Mark A. Hadley, Gordon S. W. Craig, and John Stephen Smith and assigned to the same Assignee as the present invention, describes a method of creating various interconnects on a web tape. This co-pending application is hereby incorporated herein by reference.

Co-pending U.S. patent application Ser. No. 09/279,165, entitled "Apparatuses and Methods for Forming Assemblies", filed by Jeffrey J. Jacobsen and assigned to the same Assignee as the present invention, describes a method of rolling blocks into their recessed regions. This co-pending application is hereby incorporated herein by reference.

Patent No. 5,545,291 entitled "Method for Fabricating Self-Assembling Microstructures," filed by John S. Smith and Hsi-Jen J. Yeh, issued Aug. 13, 1996.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method for fabricating an assembly, said method comprising:
   dispensing a slurry over a substrate, said slurry containing a plurality of shaped blocks which are deposited onto receptor regions of said substrate and which each contain at least one functional component;
   coupling a first flexible layer to said substrate; and
   coupling a second flexible layer to said first flexible layer.

2. The method as in claim 1, said method further comprising the step of coupling the second flexible layer to the first flexible layer through depositing a display medium onto the first flexible layer.

3. A method for fabricating an assembly having a plurality of electrical blocks, said method comprising:
   depositing a plurality of blocks onto a substrate, each of said plurality of blocks comprising at least one electrical component fabricated in a semiconductor material;
   coupling a first flexible layer to said substrate; and
   coupling a second flexible layer to said first flexible layer.

4. The method as in claim 1 or 3 further comprising coupling a third flexible layer to the second flexible layer.

5. The method as in claim 1 or 3 wherein a display backplane is coupled to the first flexible layer.

6. The method as in claim 1 or 3 wherein a fine interconnect is deposited onto the second flexible layer.

7. The method as in claim 1 or 3 wherein gross interconnect is deposited onto the third flexible layer.

8. The method as in claim 1 or 3 wherein said second flexible layer is coupled to said first flexible layer.

9. The method as in claim 1 or 3 wherein said substrate is flexible.

10. The method as in claim 1 or 3 wherein said substrate is rigid.

11. The method as in claim 1 or 3 further comprising:
    depositing a first layer of interconnect onto said first flexible layer;
    depositing a dielectric layer onto the first layer of interconnect; and
    depositing a second layer of interconnect onto the first layer of interconnect.

12. The method as in claim 1 or 3 further comprising:
    depositing a first layer of interconnect onto said second flexible layer;
    depositing a dielectric layer onto the first layer of interconnect; and
    depositing a second layer of interconnect onto the first layer of interconnect.

13. The method as in claim 1 or 3 further comprising:
    depositing a first layer of interconnect onto a first surface of the first flexible layer;
    depositing a second layer of interconnect onto a second surface of the first flexible layer.

14. The method as in claim 1 or 3 further comprising:
    depositing a first layer of interconnect onto a first surface of the second flexible layer;
    depositing a second layer of interconnect onto a second surface of the second flexible layer.

15. The method as in claim 4 further comprising:
    depositing a first layer of interconnect onto a first surface of the third flexible layer;
    depositing a second layer of interconnect onto a second surface of the third flexible layer.

16. The method as in claim 1 further comprising:
    grasping at least one shaped block with a robotic arm and depositing at least one said shaped block onto said substrate.

17. The method as in claim 1 or 3 wherein each of said shaped blocks comprises a pixel electrode for an active matrix display panel.

18. The method as in claim 1 or 3 wherein each of said shaped blocks comprises a pixel electrode for a passive matrix display panel.

19. The method as in claim 1 or 3 wherein the first flexible layer comprises a material selected from polyether sulfone, polyethylene terephthalate, polycarbonate, polybutylene terephthalate, polyphenylene sulfide, polypropylene, polyester, aramid, polyamide-imide, polyimide, aromatic polyimides, polyetherimide, metallic materials, acrylonitrile butadiene styrene, polyvinyl chloride, polyethylene naphthate, polybutylene naphthalate, and polycycloolefins.

20. The method as in claim 1 or 3 wherein the second flexible layer comprises a material selected from the group of polyether sulfone, polyethylene terephthalate, polycarbonate, polybutylene terephthalate, polyphenylene sulfide, polypropylene, polyester, aramid, polyamide-imide, polyimide, aromatic polyimides, polyetherimide, metallic materials, acrylonitrile butadiene styrene, polyvinyl choloride, polyethylene naphthate, polybutylene naphthalate, and polycycloolefins.

21. The method as in claim 4 wherein the third flexible layer comprises a material selected from the group of polyether sulfone, polyethylene terephthalate, polycarbonate, polybutylene terephthalate, polyphenylene sulfide, polypropylene, polyester, aramid, polyamide-imide, polyamide, aromatic polyimides, polyetherimide, metallic materials, acrylonitrile butadiene styrene, polyvinyl choloride, polyethylene naphthate, polybutylene naphthalate, and polycycloolefins.

22. The method as in claim 1 or 3 wherein the first flexible layer comprises a polymer material.

23. The method as in claim 1 or 3 wherein the second flexible layer comprises a polymer material.

24. The method as in claim 4 wherein the third flexible layer comprises a polymer material.

25. The method as in claim 1 or 3 wherein the second flexible layer is coupled to the first flexible layer through a display medium.

26. The method as in claim 17 wherein the assembly has a display medium which is liquid crystal.

27. The method as in claim 17 wherein the assembly has a display medium which comprises organic light emitting diode.

\* \* \* \* \*